US012150343B2

(12) United States Patent
Chang et al.

(10) Patent No.: US 12,150,343 B2
(45) Date of Patent: Nov. 19, 2024

(54) ARRAY SUBSTRATE, DISPLAY PANEL AND DISPLAY APPARATUS

(71) Applicant: KunShan Go-Visionox Opto-Electronics Co., Ltd., Kunshan (CN)

(72) Inventors: Miao Chang, Kunshan (CN); Lu Zhang, Kunshan (CN); Siming Hu, Kunshan (CN); Zhenzhen Han, Kunshan (CN)

(73) Assignee: KUNSHAN GO-VISIONOX OPTO-ELECTRONICS CO., LTD., Kunshan (CN)

( * ) Notice: Subject to any disclaimer, the term of this patent is extended or adjusted under 35 U.S.C. 154(b) by 737 days.

(21) Appl. No.: 17/382,549

(22) Filed: Jul. 22, 2021

(65) Prior Publication Data
US 2021/0351255 A1 Nov. 11, 2021

Related U.S. Application Data

(63) Continuation of application No. PCT/CN2020/084764, filed on Apr. 14, 2020.

(30) Foreign Application Priority Data

Jul. 3, 2019 (CN) .......................... 201921028547.7

(51) Int. Cl.
G09G 3/30 (2006.01)
H10K 50/80 (2023.01)
(Continued)

(52) U.S. Cl.
CPC ......... *H10K 59/1213* (2023.02); *H10K 50/84* (2023.02); *H10K 50/868* (2023.02);
(Continued)

(58) Field of Classification Search
CPC .. H10K 59/1213; H10K 50/84; H10K 50/868; H10K 59/1216; H10K 59/131;
(Continued)

(56) References Cited

U.S. PATENT DOCUMENTS

2003/0228037 A1* 12/2003 Endo .................. G06V 40/1347
382/124
2007/0085862 A1* 4/2007 Moriya ................ G09G 3/2003
345/694
(Continued)

FOREIGN PATENT DOCUMENTS

CN 107819023 A 3/2018
CN 108336117 A 7/2018
(Continued)

OTHER PUBLICATIONS

Notification for Correction issued on Dec. 11, 2019 in corresponding Chinese application No. 201921028547.7; 3 pages including Partial Machine-generated English-language translation.
(Continued)

*Primary Examiner* — Lunyi Lao
*Assistant Examiner* — Jarurat Suteerawongsa
(74) *Attorney, Agent, or Firm* — Maier & Maier, PLLC

(57) ABSTRACT

An array substrate, a display panel and a display apparatus are provided. An array substrate includes: a first display region including M display sub-regions arranged in an array, each display sub-region including first pixel units arranged in an array, and each first pixel unit including first pixels with N colors, where M is a natural number greater than 1 and N is a natural number; and a second display region adjacent to the first display region and having a light transmittance less than that of the first display region, where the first pixels with a same color in a same display sub-region are connected to a common first pixel circuit located (Continued)

in the second display region; and first pixel circuits for the first pixels with a same color in two display sub-regions adjacent to a central axis of the first display region are symmetrical with respect to the central axis.

20 Claims, 5 Drawing Sheets

(51) Int. Cl.
*H10K 50/84* (2023.01)
*H10K 59/121* (2023.01)
*H10K 59/131* (2023.01)
*H10K 59/60* (2023.01)
*G09G 3/3208* (2016.01)
*G09G 3/3233* (2016.01)

(52) U.S. Cl.
CPC ....... *H10K 59/1216* (2023.02); *H10K 59/131* (2023.02); *H10K 59/60* (2023.02); *G09G 3/30* (2013.01); *G09G 3/3208* (2013.01); *G09G 3/3233* (2013.01)

(58) Field of Classification Search
CPC ...... H10K 59/60; H10K 59/87; H10K 59/121; H10K 59/35; G09G 3/30; G09G 3/3208; G09G 3/3233; G09G 2300/0426
See application file for complete search history.

(56) References Cited

U.S. PATENT DOCUMENTS

| | | | | |
|---|---|---|---|---|
| 2015/0380435 | A1* | 12/2015 | Li | G02F 1/1368 257/72 |
| 2016/0307510 | A1* | 10/2016 | Duan | G09G 3/3258 |
| 2019/0206953 | A1* | 7/2019 | Hsieh | G09G 3/2074 |
| 2019/0310724 | A1* | 10/2019 | Yeke Yazdandoost | G02F 1/13338 |
| 2020/0312832 | A1* | 10/2020 | Chi | H10K 59/131 |
| 2020/0395418 | A1* | 12/2020 | Han | H10K 59/122 |
| 2020/0410910 | A1* | 12/2020 | Jia | H10K 59/122 |
| 2021/0376016 | A1* | 12/2021 | Hou | H10K 71/00 |
| 2022/0028311 | A1* | 1/2022 | Matsueda | G09G 3/3233 |
| 2022/0254839 | A1* | 8/2022 | Han | H10K 71/00 |

FOREIGN PATENT DOCUMENTS

| | | | | |
|---|---|---|---|---|
| CN | 108364957 | A | | 8/2018 |
| CN | 109584794 | A | | 4/2019 |
| CN | 210245501 | U | | 4/2020 |
| CN | 109962092 | B | * | 9/2021 .......... H01L 25/167 |

OTHER PUBLICATIONS

International Search Report issued on Jul. 16, 2020 in corresponding International application No. PCT/CN2020/084764; 4 pages.
Written Opinion of the International Searching Authority issued on Jul. 16, 2020 in corresponding International application No. PCT/CN2020/084764; 7 pages including Partial Machine-generated English-language translation.

* cited by examiner

ARRAY SUBSTRATE, DISPLAY PANEL AND DISPLAY APPARATUS

CROSS-REFERENCE TO RELATED APPLICATIONS

The present application is a continuation of International Application No. PCT/CN2020/084764, filed on Apr. 14, 2020, which claims priority to Chinese Patent Application No. 201921028547.7, filed on Jul. 3, 2019, both of which are hereby incorporated by reference in their entireties.

TECHNICAL FIELD

The present disclosure relates to the field of OLED display technology, and particularly to an array substrate, a display panel and a display apparatus.

BACKGROUND

With the rapid development of display apparatuses, users have higher and higher requirements for a screen-to-body ratio. Since a screen needs to have a camera, a sensor, an earpiece, and other components installed on the top thereof, an area may be generally reserved on the top of the screen, which affects an overall consistency of the screen and a full-screen display.

SUMMARY

The present disclosure provides an array substrate, a display panel and a display apparatus.

According to a first aspect of the present disclosure, there is provided an array substrate, including: a first display region including M display sub-regions arranged in an array, each of the display sub-regions including first pixel units arranged in an array, and each of the first pixel units including first pixels with N colors, where M is a natural number greater than 1 and N is a natural number; and a second display region adjacent to the first display region and having a light transmittance less than that of the first display region, where the first pixels with a same color in a same display sub-region are connected to a common first pixel circuit which is located in the second display region; and first pixel circuits for the first pixels with a same color in two of the display sub-regions in the first display region adjacent to a central axis of the first display region are symmetrical with respect to the central axis of the first display region.

According to a second aspect of the present disclosure, there is provided a display panel, including: the above-described array substrate; and an encapsulation layer encapsulated on a side of the array substrate away from a base substrate of the array substrate, where a photosensitive component is provided below the first display region, and at least a part of the first display region is surrounded by the second display region; and the encapsulation layer includes a polarizer, and the polarizer covers the second display region, or the polarizer covers the first display region and the second display region.

According to a third aspect of the present disclosure, there is provided a display apparatus, including: a main body having a component arranging region; and the above-described display panel covering the main body, where the component arranging region is located below the first display region and provided with a photosensitive component therein which emits or receives light through the first display region.

The photosensitive component includes at least one of a camera, a light sensor, or a light emitter.

As above, the first pixels with the same color in the same display sub-region may be connected to a common first pixel circuit, which can reduce the space occupied by the pixel circuits. The first pixel circuit may be provided in the second display region, which can increase the light transmittance of the first display region. The first pixel circuits for the first pixels with the same color in two of the display sub-regions in the first display region adjacent to a central axis of the first display region may be provided symmetrically with respect to the central axis of the first display region, such that the first pixel circuits for the first pixels with the same color in the two display sub-regions may be in a similar environment, thereby avoiding a significant difference in display brightness caused by an electrical difference between the two first pixel circuits, and improving the uniformity of the display brightness.

It should be understood that the above general description and the following detailed description are merely exemplary and explanatory and are not intended to limit the present disclosure.

BRIEF DESCRIPTION OF THE DRAWINGS

The drawings herein, which are incorporated into the specification and constitute a part of the specification, illustrate embodiments in accordance with the present disclosure, and are used together with the specification to explain the principle of the present disclosure.

DETAILED DESCRIPTION OF THE EMBODIMENTS

Figure 1:
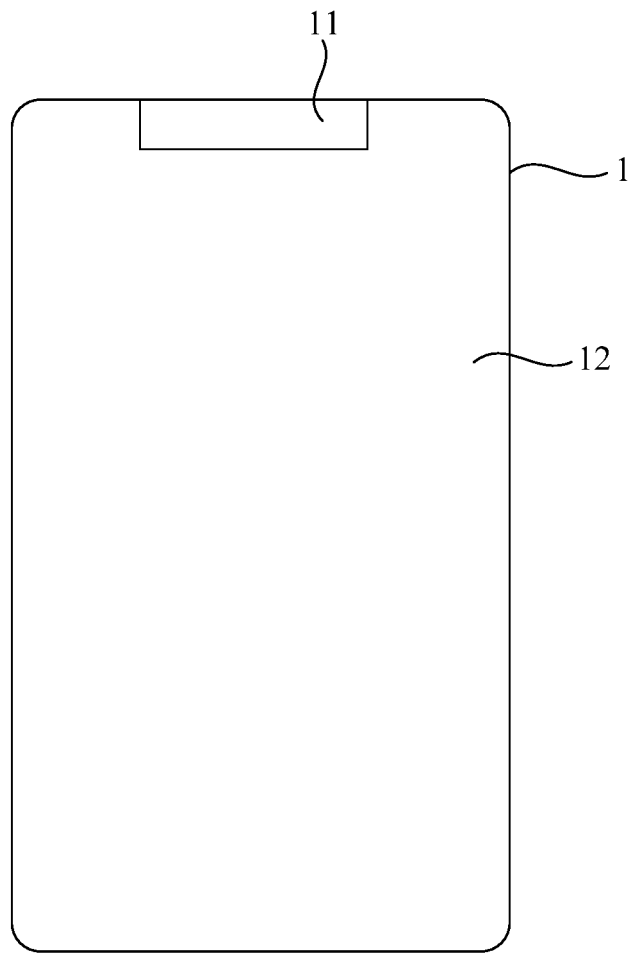
FIG. 1 illustrates a schematic structural diagram of a display apparatus.

Exemplary embodiments will be described in detail herein, and examples thereof are illustrated in the drawings. When the following description refers to the drawings, the same numbers in different drawings indicate the same or similar elements, unless otherwise indicated. The implementations described in the following exemplary embodiments do not represent all implementations in accordance with the present disclosure. Rather, they are merely examples of apparatuses and methods in accordance with some aspects of the present disclosure as detailed in the appended claims.

As shown in FIG. 1, a display apparatus 1 may include a transparent screen 11 and a main screen 12, and the transparent screen 11 may realize a light-transmission function and a display function. A photosensitive component such as a camera and a distance sensor may be provided below the transparent screen 11.

Pixel circuits for pixels in the transparent screen 11 may be disposed outside the transparent screen 11, which may effectively prevent the pixel circuits for the pixels in the transparent screen 11 from affecting an imaging effect. However, if the pixel circuits for adjacent pixels in the transparent screen are far away from each other, an electrical difference may occur between the pixel circuits, resulting in non-uniform display.

The present disclosure provides an array substrate, a display panel and a display apparatus, which may improve the display uniformity in a transparent display region.

Figure 2:
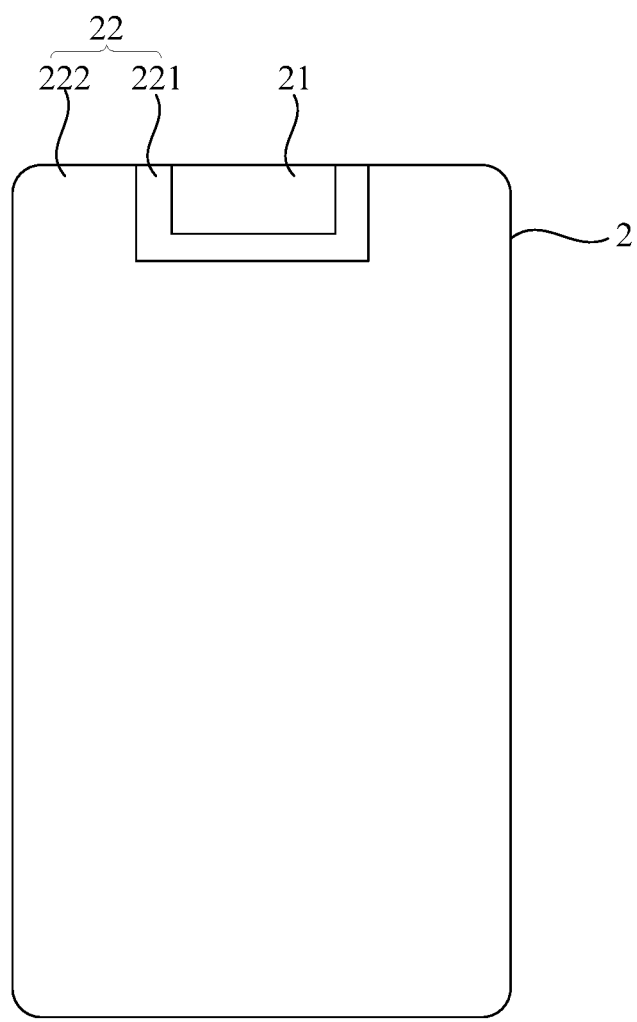
FIG. 2 is a schematic structural diagram illustrating an array substrate according to an embodiment of the present disclosure.
Figure 3:
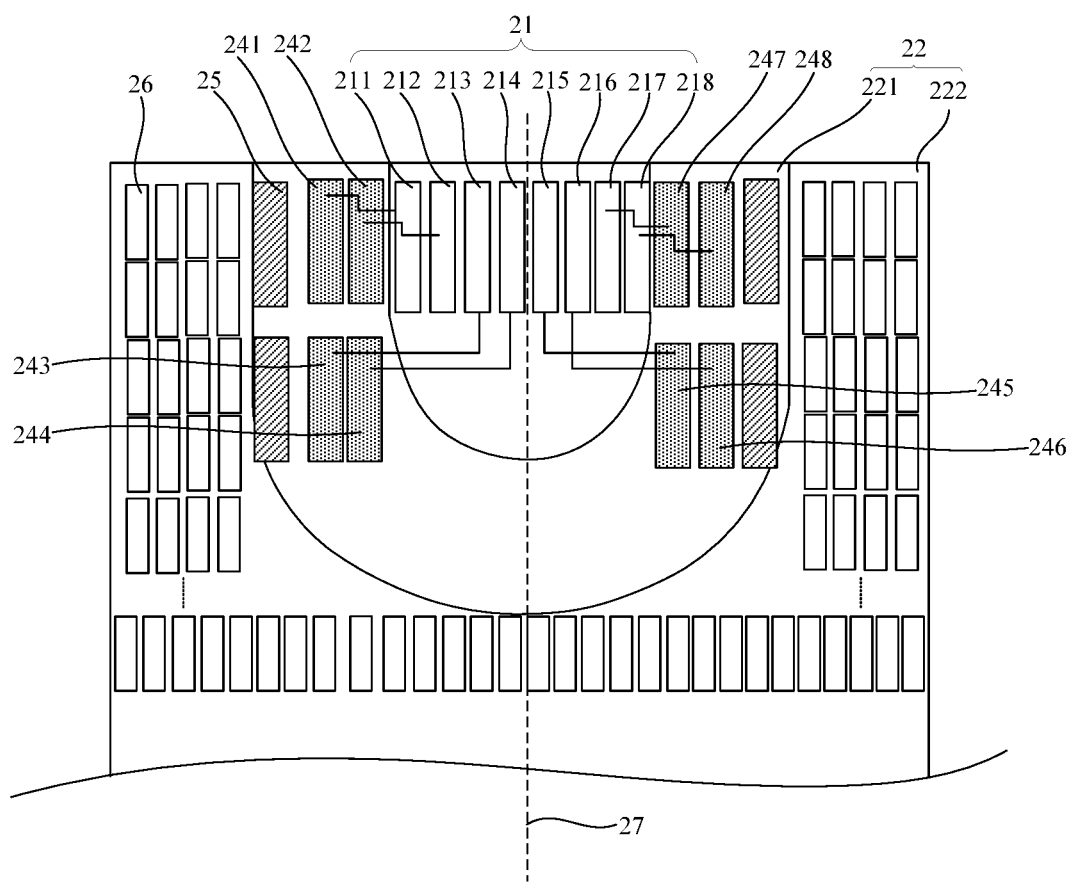
FIG. 3 is a schematic structural diagram illustrating the array substrate shown in FIG. 2.

In an embodiment, as shown in FIGS. 2 and 3, an array substrate 2 may include a first display region 21 and a second display region 22. The first display region 21 is adjacent to the second display region 22. The first display region 21 has a light transmittance greater than that of the second display region 22.

As shown in FIG. 3, the first display region 21 includes M display sub-regions 211-218 arranged in an array, each of the display sub-regions 211-218 includes first pixel units (not shown) arranged in an array, and each of the first pixel units includes first pixels (not shown) with N colors, where M is a natural number greater than 1 and N is a natural number.

The first pixels with the same color in the same display sub-region are connected to a common first pixel circuit which is located in the second display region 22. In an embodiment, the first pixel unit may include the first pixels with a red color, and the first pixels with the red color in the display sub-region 211 may be connected to a common first pixel circuit 241, the first pixels with the red color in the display sub-region 212 may be connected to a common first pixel circuit 242, the first pixels with the red color in the display sub-region 213 may be connected to a common first pixel circuit 243, the first pixels with the red color in the display sub-region 214 may be connected to a common first pixel circuit 244, the first pixels with the red color in the display sub-region 215 may be connected to a common first pixel circuit 245, the first pixels with the red color in the display sub-region 216 may be connected to a common first pixel circuit 246, the first pixels with the red color in the display sub-region 217 may be connected to a common first pixel circuit 247, and the first pixels with the red color in the display sub-region 218 may be connected to a common first pixel circuit 248. The first pixel circuits 241-248 are located in the second display region 22. The first pixels with the same color in the same display sub-region may be connected to a common first pixel circuit, which can effectively save the space occupied by the pixel circuits. The first pixel circuits may be provided in the second display region, which can effectively increase the light transmittance of the first display region.

First pixel circuits for the first pixels with the same color in two of the display sub-regions in the first display region 21 adjacent to a central axis 27 of the first display region 21 are symmetrical with respect to the central axis 27 of the first display region 21. In an embodiment, as shown in FIG. 3, the display sub-regions 214 and 215 in the first display region 21 are two display sub-regions which are adjacent to the central axis 27 of the first display region 21, and the first pixel circuit 244 for the first pixels with the red color in the display sub-region 214 and the first pixel circuit 245 for the first pixels with the red color in the display sub-region 215 are symmetrical with respect to the central axis 27 of the first display region 21. In this way, the first pixel circuits for the first pixels with the same color in the two display sub-regions may be in a similar environment, thereby effectively avoiding a significant difference in display brightness caused by an electrical difference between the two first pixel circuits and improving the uniformity of the display brightness.

In an embodiment, the N colors may include red, green, and blue colors. For example, the first pixel unit may include red, green, and blue first pixels, such that the first display region may display more colorful images.

In an embodiment, first pixel circuits for the first pixels with the same color in two of the display sub-regions in the first display region 21 symmetrical with respect to the central axis 27 may be symmetrical with respect to the central axis 27. As shown in FIG. 3, the display sub-region 211 and the display sub-region 218 are symmetrical with respect to the central axis 27, and the first pixel circuit 241 for the first pixels with the red color in the display sub-region 211 and the first pixel circuit 248 for the first pixels with the red color in the display sub-region 218 are symmetrical with respect to the central axis 27; the display sub-region 212 and the display sub-region 217 are symmetrical with respect to the central axis 27, and the first pixel circuit 242 for the first pixels with the red color in the display sub-region 212 and the first pixel circuit 247 for the first pixels with the red color in the display sub-region 217 are symmetrical with respect to the central axis 27; and the display sub-region 213 and the display sub-region 216 are symmetrical with respect to the central axis 27, and the first pixel circuit 243 for the first pixels with the red color in the display sub-region 213 and the first pixel circuit 246 for the first pixels with the red color in the display sub-region 216 are symmetrical with respect to the central axis 27. This may ensure that the first pixel circuits for the first pixels with the same color in the two display sub-regions in the first display region symmetrical with respect to the central axis are in a similar environment, such that the first pixels with the same color in the two display sub-regions have similar display brightness, allowing the display brightness of the first display region to be more uniform.

In an embodiment, the first pixel circuits for the first pixels with the same color in the adjacent display sub-regions on the same side of the central axis 27 of the first display region 21 are adjacent to each other. As shown in FIG. 3, the display sub-region 211 and the display sub-region 212 are located on the same side of the central axis 27 and adjacent to each other, and the first pixel circuit 241 for the first pixels with the red color in the display sub-region 211 and the first pixel circuit 242 for the first pixels with the red color in the display sub-region 212 are adjacent to each other. In this way, the adjacent display sub-regions may have similar display brightness, which is beneficial to more uniform display brightness.

Likewise, the display sub-regions 213 and 214 are adjacent to each other, and the first pixel circuits 243 and 244 for the first pixels with the same color in the display sub-regions 213 and 214 are adjacent to each other; the display sub-regions 215 and 216 are adjacent to each other, and the first pixel circuits 245 and 246 for the first pixels with the same color in the display sub-regions 215 and 216 are adjacent to each other; and/or the display sub-regions 217 and 218 are adjacent to each other, and the first pixel circuits 247 and 248 for the first pixels with the same color in the display sub-regions 217 and 218 are adjacent to each other. In this way, the two adjacent display sub-regions may have similar display brightness, which is beneficial to a more uniform display effect.

As shown in FIG. 3, M may be 8. The first display region 21 may include the display sub-regions 211-218 arranged in one row and eight columns. In an embodiment, four columns of the display sub-regions 211-214 in the eight columns are located on a first side of the central axis 27, and the other four columns of the display sub-regions 215-218 are located on a second side of the central axis 27, and the first side and the second side are symmetrical with respect to the central axis 27. This may effectively prevent the pixel circuits from occupying too much space due to a larger number of display sub-regions, allowing little difference in the brightness between the adjacent display sub-regions. Accordingly, the first display region may have more uniform display brightness, and the pixel circuits for the pixels in the first display region may occupy less space.

In an embodiment, the second display region 22 may include a first sub-display region 221 and a second sub-display region 222. The first sub-display region 221 may be located between the first display region 21 and the second sub-display region 222. The first sub-display region 221 may include second pixel units arranged in an array, and the second sub-display region 222 may include third pixel units arranged in an array.

Each of the second pixel units may include second pixels with N colors, and each of the third pixel units may include third pixels with N colors, such that the second display region may display more colorful images.

As shown in FIG. 3, the first sub-display region 221 may further include second pixel circuits 25 arranged in an array, and the second pixels may be connected with the second pixel circuits 25 in a one-to-one correspondence. The second pixel circuits 25 arranged in an array in the first sub-display region 221 may be symmetrical with respect to the central axis 27. This may ensure that the second pixel circuits symmetrical with respect to the central axis are in a similar environment, such that the first sub-display region may have a uniform display effect.

The first pixel circuits 241-248 may be located in an area of the first sub-display region 221 close to the first display region 21. For example, the second pixel circuits 25 may be closely arranged in an area of the first sub-display region 221 away from the first display region 21, such that there may be enough space in the first sub-display region 221 for arranging the first pixel circuits 241-248, thereby facilitating the wiring and reducing the process difficulty.

Optionally, each of the second pixel circuits may be a seven transistors and one capacitor (7T1C) pixel circuit, such that the pixels in the first sub-display region may be controlled relatively accurately, which is beneficial to improve a display quality.

Optionally, each of the first pixel circuits may be a one transistor (1T) pixel circuit, a two transistors and one capacitor (2T1C) pixel circuit, or a three transistors and one capacitor (3T1C) pixel circuit, which may effectively save the space. In another embodiment, the first pixel circuit may be a seven transistors and one capacitor (7T1C) pixel circuit, such that the pixels in the first display region may be controlled relatively accurately, which is beneficial to improve a display quality.

Optionally, the first pixel units in the first display region 21 may have a density less than that of the third pixel units in the second sub-display region 222, which is beneficial to increase the light transmittance of the first display region.

Optionally, the second pixel units in the first sub-display region 221 may have a density less than that of the third pixel units in the second sub-display region 222, such that the first sub-display region may provide space for placing the pixel circuits for the pixels in the first display region, and the display brightness of the array substrate when displaying images may be gradually transitioned from the second sub-display region to the first display region without a sharp distinction therebetween.

Optionally, the second pixel units in the first sub-display region 221 may have the same density as that of the first pixel units in the first display region 21, which may effectively avoid the visual discomfort caused by the diversity in display effects of the array substrate.

Optionally, the third pixel units in the second sub-display region 222 may have a density double that of the second pixel units in the first sub-display region 221, such that the first sub-display region may provide space for placing the pixel circuits for the pixels in the first display region, and the display quality of the first sub-display region may be effectively improved.

Optionally, each of the first pixels may have the same opening area as that of each of the second pixels, which may avoid the visual discomfort caused by the diversity in display effects of the array substrate.

Optionally, the opening area of each of the first pixels may be 4 times an opening area of each of the third pixels, which may effectively increase the light transmittance of the first display region, and effectively improve the display quality of the first display region.

Optionally, as shown in FIG. 3, the second sub-display region 222 may include third pixel circuits 26 arranged in an array, and the third pixels may be connected with the third pixel circuits 26 in a one-to-one correspondence. In this way, the pixels in the second sub-display region may be independently controlled, which is beneficial to improve the display quality.

Optionally, each of the third pixel circuits may be a seven transistors and one capacitor (7T1C) pixel circuit, such that the pixels in the second sub-display region may be controlled more accurately, which is beneficial to improve the display quality.

Optionally, the light transmittance of the first display region 21 may be greater than that of the second sub-display region 222, such that a light sensor may be provided below the first display region, and a luminous efficiency of the pixels in the second sub-display region may be effectively ensured.

Optionally, the first display region 21 may be rectangular. In other embodiments, the first display region 21 may be drop-shaped, circular, elliptical, diamond-shaped, semi-circular or semi-elliptical.

Optionally, a projection of a light-emitting area of each of the first pixels on a base substrate of the array substrate may include one first pattern unit or a plurality of first pattern units connected. Optionally, each of the first pixels may include a first electrode, an organic light-emitting layer and a second electrode. The organic light-emitting layer may be located on the first electrode, and the second electrode may be located on the organic light-emitting layer. A projection of the first electrode on the base substrate may include one second pattern unit or a plurality of second pattern units connected with each other.

Optionally, the first pattern unit and/or the second pattern unit may include a circle, an ellipse, a dumbbell shape, a gourd shape or a rectangle. The shape of the first pattern unit and/or the second pattern unit such as a circle, an ellipse, a dumbbell shape, and a gourd shape may change a periodic structure that produces diffraction, that is, the shape may change a distribution of diffraction fields, and thus reduce the diffraction. This may ensure that images captured by a camera provided below the first display region have higher definition.

Figure 4:
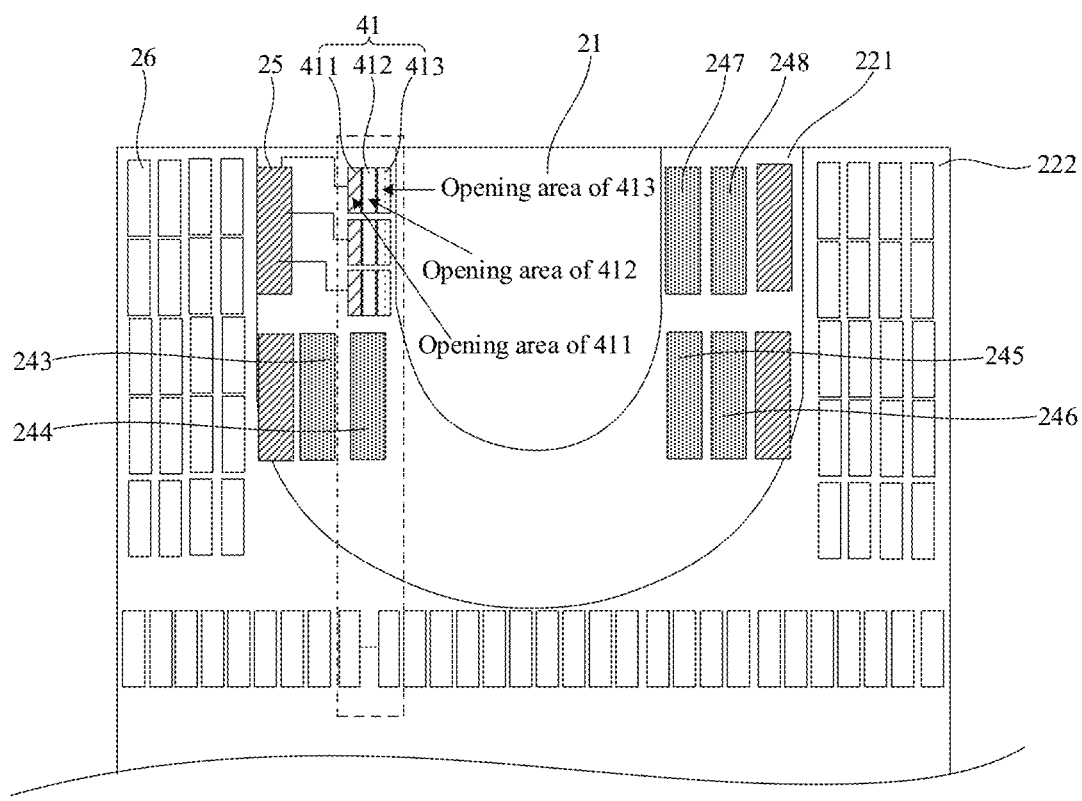
FIG. 4 is another schematic structural diagram illustrating the array substrate shown in FIG. 2.
Figure 5:
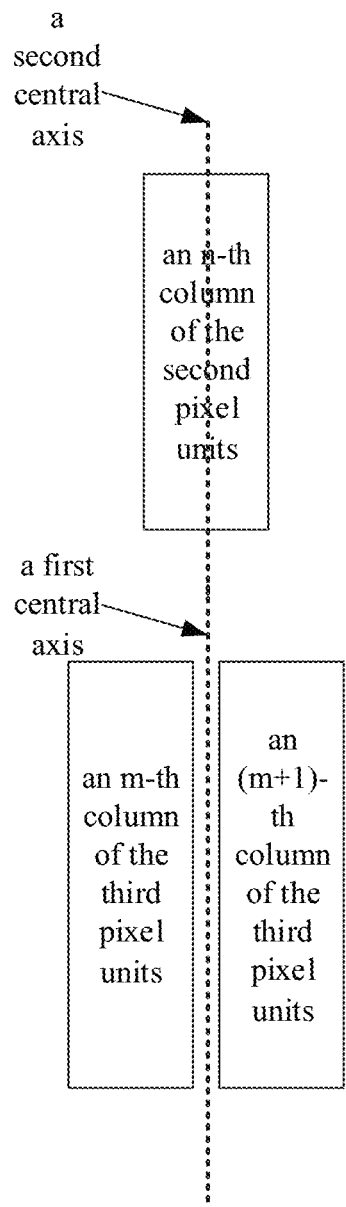
FIG. 5 is a diagram of the first and second central axes.

Optionally, as shown in FIG. 4, on the basis of the above embodiments, in a column direction of the third pixel units, a first central axis of an m-th column of the third pixel units and an (m+1)-th column of the third pixel units in the second sub-display region 222 substantially coincides with a second central axis of an n-th column of the second pixel units 41 in the first sub-display region 221, where m and n are respectively natural numbers. As shown in FIG. 5, the first central axis substantially coincides with the second central axis, which means that the first central axis completely coincides with the second central axis, or a distance between the first central axis and the second central axis is less than a specified distance.

In an embodiment, for the same color, a second pixel circuit 25 for the second pixels in the n-th column of the second pixel units 41 and a third pixel circuit for the third pixels in the m-th column of the third pixel units may be connected to a common data line, and the m-th column of the third pixel units may be closer to the first sub-display region 221 than the (m+1)-th column of the third pixel units. In an embodiment, the second pixel unit 41 may include red second pixels 411, green second pixels 412, and blue second pixels 413, and the second pixel circuit 25 for the red second pixels 411 and the third pixel circuit for red third pixels in the m-th column of the third pixel units may be connected to a common data line.

In another embodiment, for the same color, the second pixel circuit for the second pixels in the n-th column of the second pixel units and a third pixel circuit for the third pixels in the (m+1)-th column of the third pixel units may be connected to a common data line, and the (m+1)-th column of the third pixel units may be closer to the first sub-display region 221 than the m-th column of the third pixel units.

As shown in FIG. 5, when the first central axis of the m-th and the (m+1)-th columns of the third pixel units in the second sub-display region substantially coincides with the second central axis of the n-th column of the second pixel units in the first sub-display region in the column direction of the third pixel units, for the same color, the second pixel circuit for the second pixels in the n-th column of the second pixel units and the third pixel circuit for the third pixels in one of the m-th and the (m+1)-th columns of the third pixel units that is closer to the first sub-display region may be connected to a common data line. Since at a boundary between the second sub-display region and the first sub-display region, the display brightness of the third pixel unit close to the first sub-display region is lower than that of the third pixel unit away from the first sub-display region, and the display brightness of the third pixel unit close to the first sub-display region is similar to that of the second pixel unit, connecting the respective pixel circuits for the second pixels and the third pixels with the similar display brightness to a common data line may effectively avoid non-uniform display brightness at the boundary between the first sub-display region and the second sub-display region.

Figure 6:
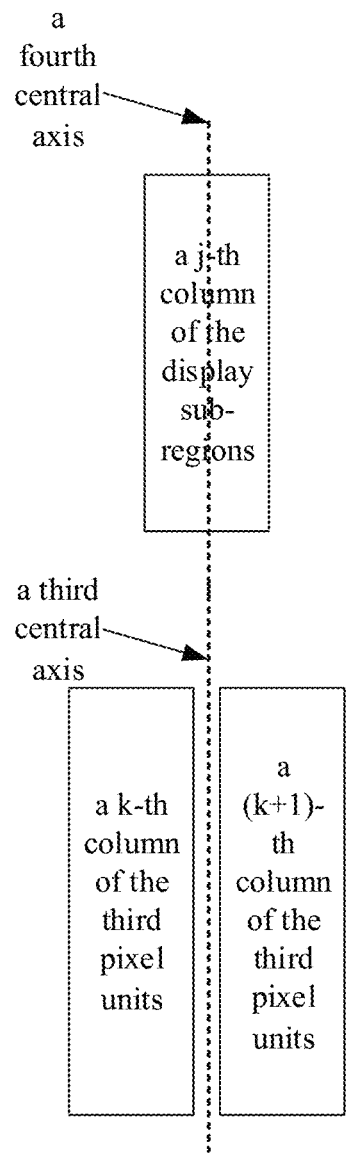
FIG. 6 is a diagram of the third and fourth central axes.

As shown in FIG. 4, on the basis of the above embodiments, in a column direction of the third pixel units, a third central axis of a k-th column of the third pixel units and a (k+1)-th column of the third pixel units in the second sub-display region 222 substantially coincides with a fourth central axis of a j-th column of the display sub-regions in the first display region 21, where j and k are respectively natural numbers. As shown in FIG. 6, the third central axis substantially coincides with the fourth central axis, which means that the third central axis completely coincides with the fourth central axis, or a distance between the third central axis and the fourth central axis is less than a specified distance.

In an embodiment, for the same color, a first pixel circuit for the first pixels in the j-th column of the display sub-regions and a third pixel circuit for the third pixels in the k-th column of the third pixel units may be connected to a common data line, and the k-th column of the third pixel units may be closer to the first sub-display region 221 than the (k+1)-th column of the third pixel units.

In another embodiment, for the same color, the first pixel circuit for the first pixels in the j-th column of the display sub-regions and a third pixel circuit for the third pixels in the (k+1)-th column of the third pixel units may be connected to a common data line, and the (k+1)-th column of the third pixel units may be closer to the first sub-display region 221 than the k-th column of the third pixel units.

As shown in FIG. 6, when the third central axis of the k-th and the (k+1)-th columns of the third pixel units in the second sub-display region substantially coincides with the fourth central axis of the j-th column of the display sub-regions in the first display region in the column direction of the third pixel units, for the same color, the first pixel circuit for the first pixels in the j-th column of the display sub-regions and the third pixel circuit for the third pixels in one of the k-th and the (k+1)-th columns of the third pixel units that is closer to the first sub-display region may be connected to a common data line. Since at a boundary between the second sub-display region and the first sub-display region, the display brightness of the third pixel unit close to the first sub-display region is lower than that of the third pixel unit away from the first sub-display region, and the display brightness of the third pixel unit close to the first sub-display region is similar to that of the first pixel unit, connecting the respective pixel circuits for the first pixels and the third pixels with the similar display brightness to a common data line may effectively avoid non-uniform display brightness at the boundary between the first sub-display region and the second sub-display region.

The present disclosure further provides a display panel, including the array substrate according to any of the above embodiments, and an encapsulation layer.

The encapsulation layer is encapsulated on a side of the array substrate away from a base substrate of the array substrate.

At least one photosensitive component may be provided below the first display region, and at least a part of the first display region may be surrounded by the second display region.

The encapsulation layer may include a polarizer, and the polarizer may cover the second display region, or the polarizer may cover the first display region and the second display region.

The present disclosure further provides a display apparatus, including a main body and the display panel according to any of the above embodiments.

The display panel may cover the main body. The main body may have a component arranging region. The component arranging region may be located below the first display region and provided with at least one photosensitive component therein which emits or receives light through the first display region.

The photosensitive component may include at least one of a camera, a light sensor, or a light emitter.

In an embodiment, the display apparatus may include any product or component with a display function, such as electronic paper, mobile phone, tablet computer, television, notebook computer, digital photo frame, and navigator.

It should be understood that the present disclosure is not limited to the precise structure that has been described above and shown in the drawings, and various modifications and changes may be made without departing from the scope thereof. The scope of the present disclosure is only limited by the appended claims.

The invention claimed is:
1. An array substrate, comprising:
a first display region comprising M display sub-regions arranged in array, wherein each display sub-region of the display sub-regions comprises first pixel units arranged in the array, each first pixel unit of the first pixel units comprises first pixels with N colors, M is a natural number greater than 1, and N is a natural number; and
a second display region adjacent to the first display region and having a light transmittance less than a light transmittance of the first display region, wherein the second display region comprises a first sub-display region and a second sub-display region, the first sub-display region is located between the first display region and the second sub-display region, the first sub-display region comprises second pixel units arranged in the array, the second sub-display region comprises third pixel units arranged in the array, each of the second pixel units comprises second pixels with N colors, each of the third pixel units comprises third pixels with N colors,
in a column direction of the third pixel units, a first central axis of an m-th column of the third pixel units and an (m+1)-th column of the third pixel units in the second sub-display region substantially coincides with a second central axis of an n-th column of the second pixel units in the first sub-display region, m and n are respectively natural numbers, wherein the third pixel unit, at the m-th column and the (m+1)-th column, do not overlap the first central axis,
in a column direction of the third pixel units, a third central axis of a k-th column of the third pixel units and a (k+1)-th column of the third pixel units in the second sub-display region coincides with a fourth central axis of a j-th column of the display sub-regions in the first display region, j and k are respectively natural numbers, wherein the third pixel unit, at the j-th column and the (i+1)-th column, do not overlap the third central axis.

2. The array substrate according to claim 1, wherein two first pixel circuits for the first pixels with the same color in two of the display sub-regions symmetrical with respect to the central axis of the first display region are symmetrical with respect to the central axis.

3. The array substrate according to claim 1, wherein M is 8 and the array of the display sub-regions has one row and eight columns, four columns of the display sub-regions in the eight columns are located on a first side of the central axis, the other four columns of the display sub-regions are located on a second side of the central axis, and the first side and the second side are symmetrical with respect to the central axis.

4. The array substrate according to claim 1, wherein the third pixel units in the second sub-display region has a density greater than that of the second pixel units in the first sub-display region.

5. The array substrate according to claim 1, wherein the first sub-display region further comprises second pixel circuits arranged in the array and connected with the second pixels, the second sub-display region comprises a plurality of third pixel circuits arranged in the array and connected with the third pixels,
for a same color, a second pixel circuit for the second pixels in the n-th column of the second pixel units and a third pixel circuit for the third pixels in the m-th column of the third pixel units are connected to a common data line, and the m-th column of the third pixel units are closer to the first sub-display region than the (m+1)-th column of the third pixel units, or the second pixel circuit for the second pixels in the n-th column of the second pixel units and a third pixel circuit for the third pixels in the (m+1)-th column of the third pixel units are connected to a common data line, and the (m+1)-th column of the third pixel units are closer to the first sub-display region than the m-th column of the third pixel units.

6. The array substrate according to claim 1, wherein the second sub-display region comprises a plurality of third pixel circuits arranged in the array and connected with the third pixels, the first pixels with a same color in a same display sub-region are connected to a common first pixel circuit which is located in the second display region,
for a same color, the first pixel circuit for the first pixels in the j-th column of the display sub-regions and a third pixel circuit for the third pixels in the k-th column of the third pixel units are connected to a common data line, and the k-th column of the third pixel units are closer to the first sub-display region than the (k+1)-th column of the third pixel units, or the first pixel circuit for the first pixels in the j-th column of the display sub-regions and a third pixel circuit for the third pixels in the (k+1)-th column of the third pixel units are connected to a common data line, and the (k+1)-th column of the third pixel units are closer to the first sub-display region than the k-th column of the third pixel units.

7. The array substrate according to claim 1, wherein the first sub-display region further comprises second pixel circuits arranged in the array, the second pixels are connected with the second pixel circuits in a one-to-one correspondence, and the second pixel circuits are symmetrical with respect to the central axis.

8. The array substrate according to claim 7, wherein the second sub-display region comprises a plurality of third pixel circuits arranged in the array and the third pixels are connected with the third pixel circuits in a one-to-one correspondence.

9. The array substrate according to claim 8, further comprising:
a plurality of first pixel circuits connected to the first pixels, wherein each of the third pixel circuits is a seven transistors and one capacitor pixel circuit, each of the second pixel circuits is a seven transistors and one capacitor pixel circuit, and each of the first pixel circuits is a one transistor pixel circuit, a two transistors and one capacitor pixel circuit, a three transistors and one capacitor pixel circuit, or a seven transistors and one capacitor pixel circuit.

10. The array substrate according to claim 1, further comprising:
a plurality of first pixel circuits connected to the first pixels, wherein the plurality of first pixel circuits is located in an area of the first sub-display region close to the first display region.

11. The array substrate according to claim 1, wherein the first pixel units in the first display region have a density less than a density of the third pixel units in the second sub-display region, and a light transmittance of the first display region is greater than a light transmittance of the second sub-display region.

12. The array substrate according to claim 1, wherein the second pixel units in the first sub-display region have a same density as a density of the first pixel units in the first display region.

13. The array substrate according to claim 1, wherein the third pixel units in the second sub-display region have a density double that of a density of the second pixel units in the first sub-display region.

14. The array substrate according to claim 1, wherein each of the first pixels has a same opening area as each of the second pixels; and the opening area of each of the first pixels is 4 times an opening area of each of the third pixels.

15. The array substrate according to claim 1, wherein the first display region is drop-shaped, circular, rectangular, elliptical, diamond-shaped, semi-circular or semi-elliptical.

16. The array substrate according to claim 1, wherein a projection of a light-emitting area of each of the first pixels on a base substrate of the array substrate comprises at least one first pattern unit, each of the first pixels comprises a first electrode, an organic light-emitting layer and a second electrode, the organic light-emitting layer is located on the first electrode, and the second electrode is located on the organic light-emitting layer, a projection of the first electrode on the base substrate comprises at least one second pattern unit, the first pattern unit and/or the second pattern unit comprises a circle, an ellipse, a dumbbell shape, a gourd shape or a rectangle.

17. A display apparatus, comprising:
a main body having a component arranging region; and
a display panel covering the main body and comprising the array substrate according to claim 1, and an encapsulation layer encapsulated on a side of the array substrate away from a base substrate of the array substrate, wherein at least one photosensitive component is provided below the first display region, at least a part of the first display region is surrounded by the second display region, and the component arranging region is located below the first display region and provided with at least one photosensitive component therein which emits or receives light through the first display region.

18. The array substrate according to claim 1, wherein first pixel circuits connected to the first pixels with a same color in two of the display sub-regions adjacent to a central axis of the first display region are symmetrical with respect to the central axis of the first display region.

19. The array substrate according to claim 1, wherein the first pixels with a same color in a same display sub-region are connected to a common first pixel circuit which is located in the second display region, and a projection of the common first pixel circuit on a base substrate of the array substrate is arranged separately from a projection of the first pixels connected to the common first pixel circuit on a base substrate of the array substrate.

20. The array substrate according to claim 1, wherein the array substrate further comprises a plurality of first pixel circuits located in the second display region and connected to the first pixels, and a projection of the first pixel circuit on a base substrate of the array substrate is arranged separately from a projection of the first pixel connected to the first pixel circuit on a base substrate of the array substrate.

* * * * *